US010484007B2

(12) United States Patent
Paik

(10) Patent No.: US 10,484,007 B2
(45) Date of Patent: Nov. 19, 2019

(54) SEMICONDUCTOR DEVICE

(71) Applicant: SK hynix Inc., Icheon-si, Gyeonggi-do (KR)

(72) Inventor: Woo Hyun Paik, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 21 days.

(21) Appl. No.: 15/628,857

(22) Filed: Jun. 21, 2017

(65) Prior Publication Data

US 2018/0212621 A1 Jul. 26, 2018

(30) Foreign Application Priority Data

Jan. 26, 2017 (KR) ........................ 10-2017-0012555

(51) Int. Cl.

| | |
|---|---|
| ***H03M 13/11*** | (2006.01) |
| ***H04J 3/16*** | (2006.01) |
| ***H04L 1/24*** | (2006.01) |
| ***H04L 1/00*** | (2006.01) |
| ***G11C 5/02*** | (2006.01) |
| ***G11C 17/16*** | (2006.01) |
| ***G11C 29/02*** | (2006.01) |
| ***G11C 29/00*** | (2006.01) |
| ***G11C 7/10*** | (2006.01) |
| ***G11C 29/44*** | (2006.01) |

(52) U.S. Cl.

CPC ............ *H03M 13/11* (2013.01); *G11C 5/025* (2013.01); *G11C 17/16* (2013.01); *G11C 29/027* (2013.01); *G11C 29/787* (2013.01); *H04J 3/1611* (2013.01); *H04L 1/0057* (2013.01); *H04L 1/245* (2013.01); *G11C 7/1006* (2013.01); *G11C 2029/4402* (2013.01)

(58) Field of Classification Search

CPC .... H03M 13/11; G11C 7/1006; H04L 1/0057; H04L 1/245; H04J 3/1611

See application file for complete search history.

(56) References Cited

U.S. PATENT DOCUMENTS

| | | | | |
|---|---|---|---|---|
| 2012/0188830 | A1* | 7/2012 | Jeong | G11C 7/20 365/189.07 |
| 2014/0006902 | A1* | 1/2014 | Yang | G11C 29/42 714/768 |
| 2014/0322830 | A1* | 10/2014 | Ide | G11C 29/40 438/4 |
| 2015/0348645 | A1* | 12/2015 | Kasorla | G11C 17/18 365/96 |
| 2017/0161202 | A1* | 6/2017 | Erez | G06F 12/0246 |

* cited by examiner

*Primary Examiner* — Thien Nguyen
(74) *Attorney, Agent, or Firm* — William Park & Associates Ltd.

(57) ABSTRACT

Disclosed may be a repair information storage circuit. The repair information storage circuit may include a fuse set. A plurality of fuses included in the fuse set may be allocated to the respective bits of preliminary repair information and defect check information. The fuse allocated to the defect check information may be ruptured to store information on whether the fuse set has a defect.

10 Claims, 4 Drawing Sheets

SEMICONDUCTOR DEVICE

CROSS-REFERENCES TO RELATED APPLICATION

The present application claims priority under 35 U.S.C. § 119(a) to Korean application number 10-2017-0012555, filed on Jan. 26, 2017, in the Korean Intellectual Property Office, which is incorporated herein by reference in its entirety.

BACKGROUND

1. Technical Field

Various embodiments may generally relate to a semiconductor device, and more particularly, to a repair information processing circuit and a semiconductor apparatus including the repair information processing circuit.

2. Related Art

Through testing, a semiconductor apparatus may detect a memory cell in which a defect has occurred (hereafter, referred to as defective cell).

An address for accessing a defective cell may be referred to as repair information.

The repair information may be stored in a fuse array, on a basis of a fuse set.

When an address provided from outside the semiconductor apparatus is an address for accessing a defective cell during an operation of the semiconductor apparatus, a redundant memory cell (hereafter, referred to as redundant cell) allocated to the defective cell may be accessed instead of the defective cell.

An operation of storing repair information and accessing a redundant cell allocated to a defective cell instead of the defective cell may be referred to as a repair operation.

An operation of processing the stored repair information such that the repair information can be efficiently used for a repair operation may serve as an important factor in the capability of determining the operation performance of the semiconductor apparatus.

SUMMARY

In an embodiment of the present disclosure, there may be provided a preliminary repair information storage circuit. The preliminary repair information storage circuit may include a fuse set. A plurality of fuses included in the fuse set may be allocated to the respective bits of preliminary repair information and defect check information. The fuse allocated to the defect check information may be ruptured to store information on whether the fuse set has a defect.

In an embodiment of the present disclosure, a repair information processing circuit may be provided. The repair information processing circuit may include a repair information storage circuit including a fuse set for storing preliminary repair information and defect check information. The repair information processing circuit may include an error calculation circuit configured to generate repair information according to the preliminary repair information, and generate a validity determination bit as one piece of information in the repair information, using the preliminary repair information and the defect check information. The validity determination bit may define whether the fuse set has a defect.

In an embodiment of the present disclosure, a semiconductor apparatus may be provided. The semiconductor apparatus may include a preliminary repair information storage circuit including a fuse set for storing preliminary repair information and defect check information. The semiconductor apparatus may include an error calculation circuit configured to generate repair information according to the preliminary repair information, and generate a validity determination bit as one piece of information in the repair information, using the preliminary repair information and the defect check information. The validity determination bit may define whether the fuse set has a defect. The semiconductor apparatus may include a memory array block configured to set the fuse set in an unavailable state according to the validity determination bit.

DETAILED DESCRIPTION

Hereinafter, a repair information processing circuit and a semiconductor apparatus including the same according to the present disclosure will be described below with reference to the accompanying drawings through examples of embodiments.

Various embodiments may be directed to a repair information processing circuit capable of efficiently storing and processing repair information, and a semiconductor apparatus including the same.

For reference, an embodiment including additional components may be provided. Furthermore, an active high or active low configuration indicating an active state of a signal or circuit may be changed depending on embodiments. Furthermore, the configuration of a logic gate or logic gates required for implementing the same function or operation may be modified. That is, the logic gate configuration of one type of operation and another logic gate configuration for the same type of operation may be replaced with each other, depending on a specific situation. If necessary, various logic gates may be applied to implement the configurations.

In an embodiment, a semiconductor device may include a semiconductor apparatus. A semiconductor apparatus 100 according to an embodiment may be embodied in the form of, for example but not limited to, a SIP (System In Package), MCP (Multi-Chip Package) or SOC (System On Chip), or embodied in the form of POP (Package On Package) including a plurality of packages.

Figure 1:
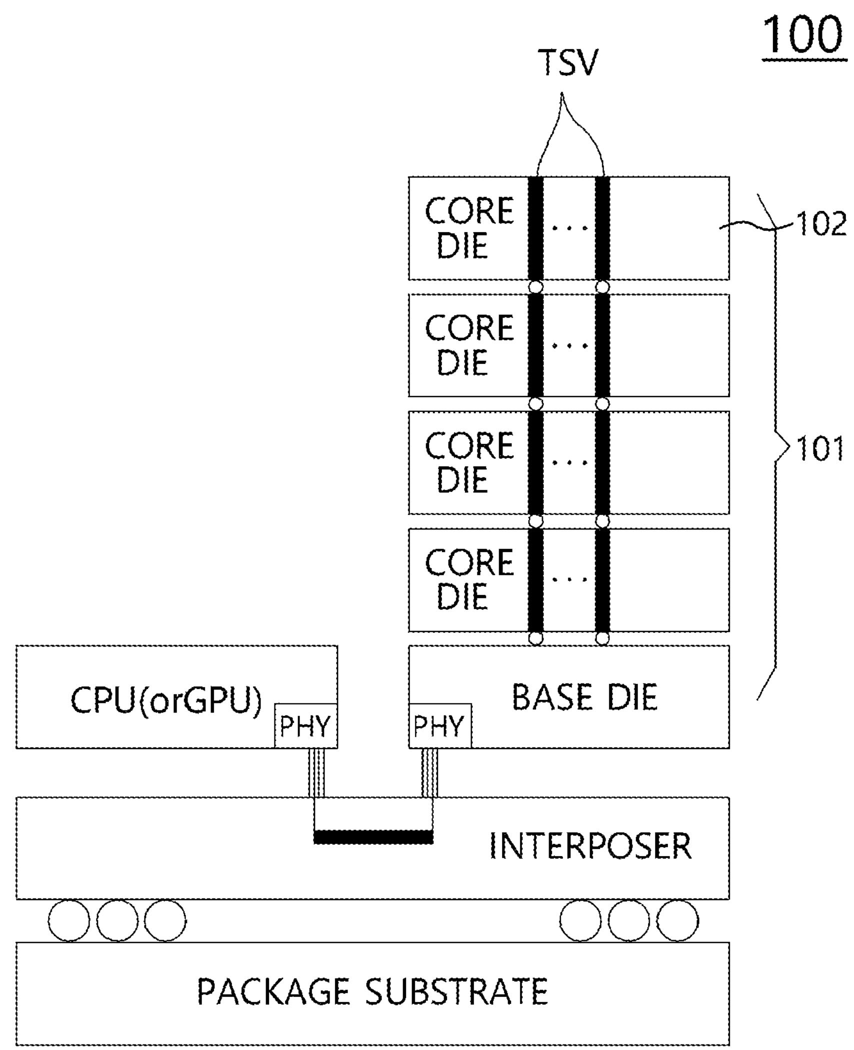
FIG. 1 is a diagram illustrating the configuration of a semiconductor apparatus 100 according to an embodiment.

Referring to FIG. 1, the semiconductor apparatus 100 according to a present embodiment may include a semiconductor memory 101, that is, a stacked semiconductor memory 101 having a plurality of dies stacked therein, a memory controller (central processing unit CPU or graphics processing unit GPU), an interposer and a package substrate.

The semiconductor memory 101 may be configured in the form of HBM (High Bandwidth Memory) which has a high bandwidth by increasing the number of input and output (input/output) units through a structure in which a plurality of dies are stacked and electrically connected through a through-electrode, for example, a TSV (Through Silicon Via).

The interposer may be coupled to the top of the package substrate.

The stacked semiconductor memory 101 and the memory controller (CPU or GPU) may be coupled to the top of the interposer.

Physical regions PHY of the stacked semiconductor memory 101 and the memory controller (CPU or GPU) may be coupled through the interposer.

The stacked semiconductor memory 101 may include the plurality of dies stacked therein.

The plurality of dies may include a base die and a plurality of core dies 102.

The base die and the plurality of core dies 102 may be electrically coupled through the plurality of through-electrodes.

A repair information processing circuit 103 (see FIG. 2) according to a present embodiment may be installed in a core die 102 or the base die of the stacked semiconductor memory 101 of FIG. 1, or installed in a core die 102 and the base die of the stacked semiconductor memory 101.

Figure 2:
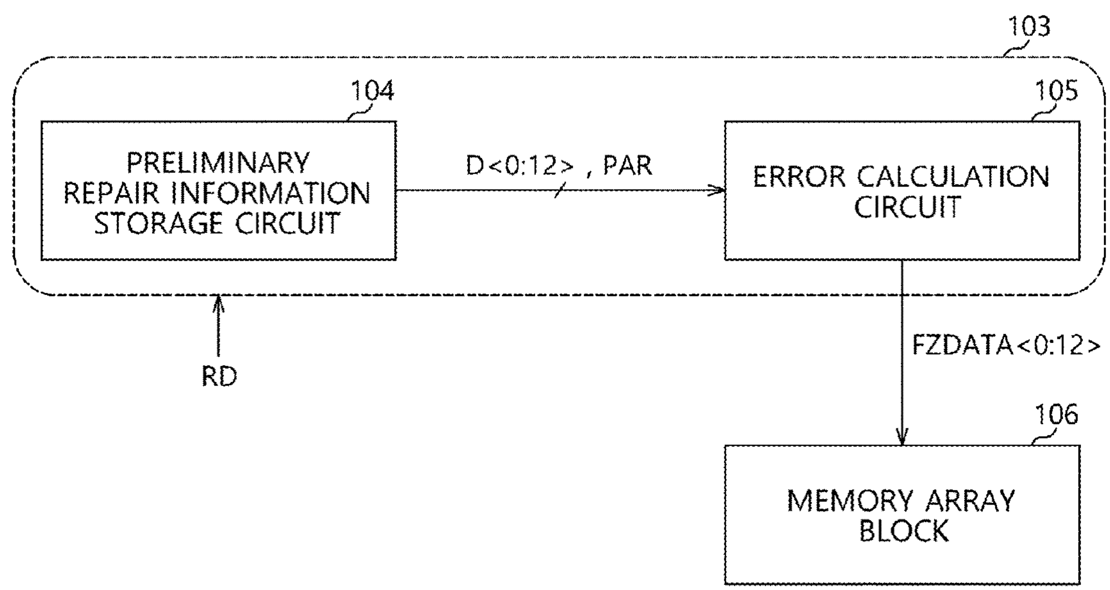
FIG. 2 is a diagram illustrating the configuration of a repair information processing circuit 103 according to a present embodiment.

Referring to FIG. 2, the repair information processing circuit 103 according to a present embodiment may include a preliminary repair information storage circuit 104 and an error calculation circuit 105.

The preliminary repair information storage circuit 104 may store preliminary repair information D<0:12> and defect check information PAR.

The preliminary repair information storage circuit 104 may output the preliminary repair information D<0:12> and the defect check information PAR according to a read command RD, for example, a read command RD generated in a boot-up mode.

The error calculation circuit 105 may generate repair information FZDATA<0:12> containing a validity determination bit FZDATA<0>, using the preliminary repair information D<0:12> and the defect check information PAR.

A parity bit which is added to check whether an error is contained in received information may be used as the defect check information PAR according to a present embodiment.

The validity determination bit FZDATA<0> may be used as a signal for determining whether information FZDATA<1:12> of the repair information FZDATA<0:12> is valid, the information FZDATA<1:12> representing an actual defective address value.

The error calculation circuit 105 may buffer information D<1:12> corresponding to a part of the preliminary repair information D<0:12>, and output the buffered information as the information FZDATA<1:12> excluding the validity determination bit FZDATA<0>.

According to the validity determination bit FZDATA<0> of the repair information FZDATA<0:12>, the memory array block 106 may determine that the corresponding fuse set 200 (see FIG. 3) cannot be used. In this case, the repair operation may not be performed.

The memory array block 106 may determine whether the information FZDATA<1:12> representing the actual defective address value is valid, according to the validity determination bit FZDATA<0> of the repair information FZDATA<0:12>.

The memory array block 106 may determine whether to perform a repair operation, according to the validity determination bit FZDATA<0> of the repair information FZDATA<0:12>, the repair operation including storing the repair information and accessing a redundant cell allocated to a defective cell instead of the defective cell.

For example, when the validity determination bit FZDATA<0> is logic high, the memory array block 106 may determine that the information FZDATA<1:12> is valid, and perform a repair operation. On the other hand, when the validity determination bit FZDATA<0> is logic low, the memory array block may determine that the information FZDATA<1:12> is not valid, and not perform a repair operation. Further, the logic levels of the signals may be different from or the opposite of those described. For example, a signal described as having a logic "high" level may alternatively have a logic "low" level, and a signal described as having a logic "low" level may alternatively have a logic "high" level.

Figure 3:
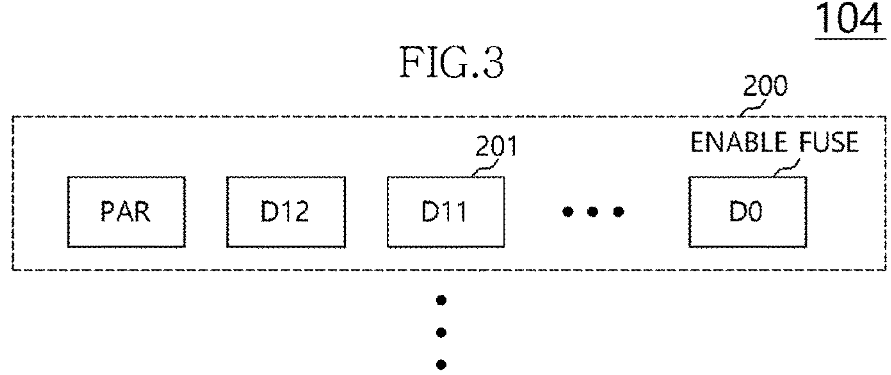
FIG. 3 is a diagram illustrating the configuration of a preliminary repair information storage circuit 104 of FIG. 2.

Referring to FIG. 3, the preliminary repair information storage circuit 104 may include a plurality of fuse sets 200.

Each of the fuse sets 200 may include a plurality of fuses 201.

The plurality of fuses 201 may be allocated to the respective bits of the preliminary repair information D<0:12> and the defect check information PAR.

The preliminary repair information storage circuit 104 may rupture a fuse allocated to the defect check information PAR, and store information indicating whether the corresponding fuse set 200 has a defect.

The plurality of fuses 201 may store the preliminary repair information D<0:12> and the defect check information PAR at desired logic levels (logic high or logic low), depending on whether the fuses 201 are ruptured.

In the preliminary repair information D<0:12>, the bit D<0> may be used as a signal indicating that a defective address is stored in the corresponding fuse set 200, that is, a signal defining that the corresponding fuse set 200 was used, and the fuse allocated to the bit D<0> may be referred to as an enable fuse.

For example, when the fuse allocated to the bit D<0>, that is, the enable fuse is ruptured, the bit D<0> may have a logic high value, and when the enable fuse is not ruptured but retains the original state, the bit D<0> may have a logic low value.

Therefore, when a defective address is stored in the information D<1:12>, the enable fuse may be ruptured to set the bit D<0> to a logic high value.

On the other hand, when a defective address is not stored in the information D<1:12>, the enable fuse may not be ruptured, but needs to be maintained in the original state, such that the bit D<0> has a logic low value.

The defect check information PAR may use a spare fuse among the fuses included in the fuse set 200, or use a fuse which is added when the fuse set 200 is designed.

The defect check information PAR may be used to set the validity determination bit FZDATA<0> to a logic low level indicating an invalid state.

For example, before a repair operation is performed, that is, when none of the plurality of fuses 201 is ruptured, all of the plurality of fuses 201 in the fuse set 200 may store a logic low value as the initial value.

However, when a defect occurred in any one of the plurality of fuses 201 in the fuse set 200, that is, when a physical defect is present in a fuse without a normal rupture operation, the corresponding fuse may store a logic high value as the initial value.

When a defect is detected in any one of the plurality of fuses 201 in the fuse set 200, the repair information processing circuit according to a present embodiment may rupture the fuse allocated to the defect check information PAR or not rupture the fuse allocated to the defect check information PAR. Then, the number of logic high values in the values of the preliminary repair information D<0:12> and the defect check information PAR may be set to an odd number, such that the validity determination bit FZDATA<0> has a logic low value.

Figure 4:
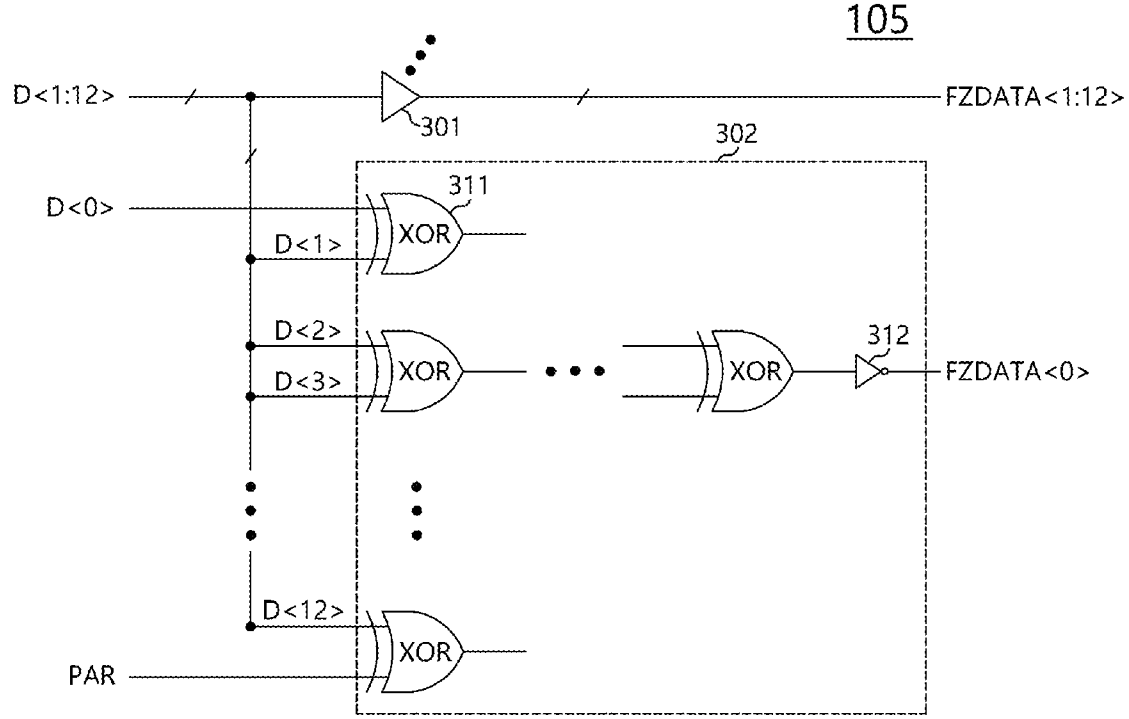
FIG. 4 is a diagram illustrating the configuration of an error calculation circuit 105 in FIG. 2.

Referring to FIG. 4, the error calculation circuit 105 may include a plurality of buffers 301 and a validity determination bit generation circuit 302.

The plurality of buffers 301 may bypass the corresponding bits D<1:12> of the preliminary repair information D<0:12>, and output the bypassed bits as the repair information FZDATA<1:12> excluding the validity determination bit FZDATA<0>.

The validity determination bit generation circuit 302 may perform error calculation using the preliminary repair information D<0:12> and the defect check information PAR, and output the result value of the error calculation as the validity determination bit FZDATA<0>.

The validity determination bit generation circuit 302 may include a plurality of logic gates (XOR) 311 and an inverter 312.

The plurality of logic gates 311 may perform an XOR operation on the preliminary repair information D<0:12> and the defect check information PAR, and output the operation result.

The plurality of logic gates 311 may repeatedly perform a two-bit XOR operation on the preliminary repair information D<0:12> and the defect check information PAR, and output the operation result.

At this time, when an even number of logic high values are included in the preliminary repair information D<0:12> and the defect check information PAR, the final output of the plurality of logic gates 311 may have a logic low value.

On the other hand, when an odd number of logic high values are included in the preliminary repair information D<0:12> and the defect check information PAR, the final output of the plurality of logic gates 311 may have a logic high value.

The inverter 312 may invert the final output of the plurality of logic gates 311, and output the inverted signal as the validity determination bit FZDATA<0>.

Therefore, when an even number of logic high values are included in the preliminary repair information D<0:12> and the defect check information PAR, that is, when the fuse set 200 has no defect, the validity determination bit FZDATA<0> may be outputted as logic high.

On the other hand, when an odd number of logic high values are included in the preliminary repair information D<0:12> and the defect check information PAR, that is, when the fuse set 200 has a defect, the validity determination bit FZDATA<0> may be outputted as logic low.

Figure 5A:
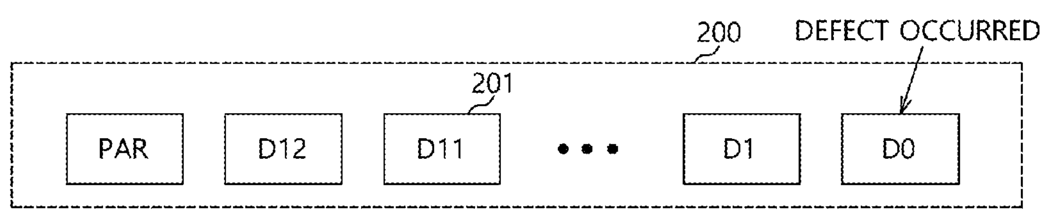
FIGS. 5A and 5B are diagrams for describing a method for processing a fuse set in a defect occurred, according to an embodiment.
Figure 5B:
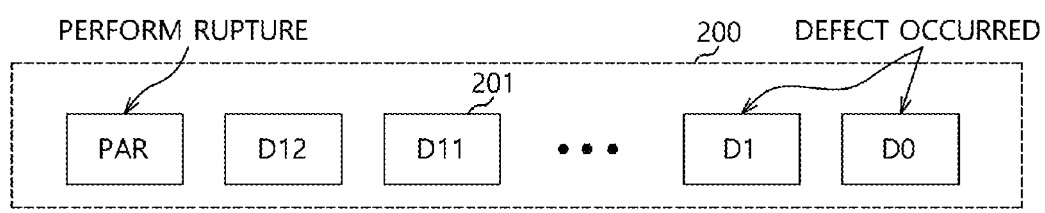

Referring to FIGS. 5A and 5B, a method for processing a fuse set in which a defect occurred will be described. For example, the method may indicate a method for setting the number of logic high values to an odd value, the logic high values being included in the values of the preliminary repair information D<0:12> and the defect check information PAR.

Referring to FIG. 5A, when the enable fuse among the plurality of fuses 201 has a defect and the other fuses are normal, a logic high value may be stored in the bit D<0>, and the other fuses may store logic low values.

Since only the bit D<0> of the preliminary repair information D<0:12> is logic high, the preliminary repair information D<0:12> may contain an odd number of logic high values.

Therefore, the fuse allocated to the defect check information PAR may not be ruptured but retain the original state, such that the number of logic high values included in the preliminary repair information D<0:12> and the defect check information PAR is set to an odd number.

Referring to FIG. 5B, when fuses allocated to the bits D<0> and D<1> among the plurality of fuses 201 have a defect and the other fuses are normal, logic high values may be stored in the bits D<0> and D<1>, and the other fuses may store logic low values.

Since the bits D<0> and D<1> of the preliminary repair information D<0:12> are logic high, the number of logic high values contained in the preliminary repair information D<0:12> may be set to an even number.

Therefore, the fuse allocated to the defect check information PAR may be ruptured to set the number of logic high values included in the preliminary repair information D<0:12> and the defect check information PAR to an odd number.

Figure 6:
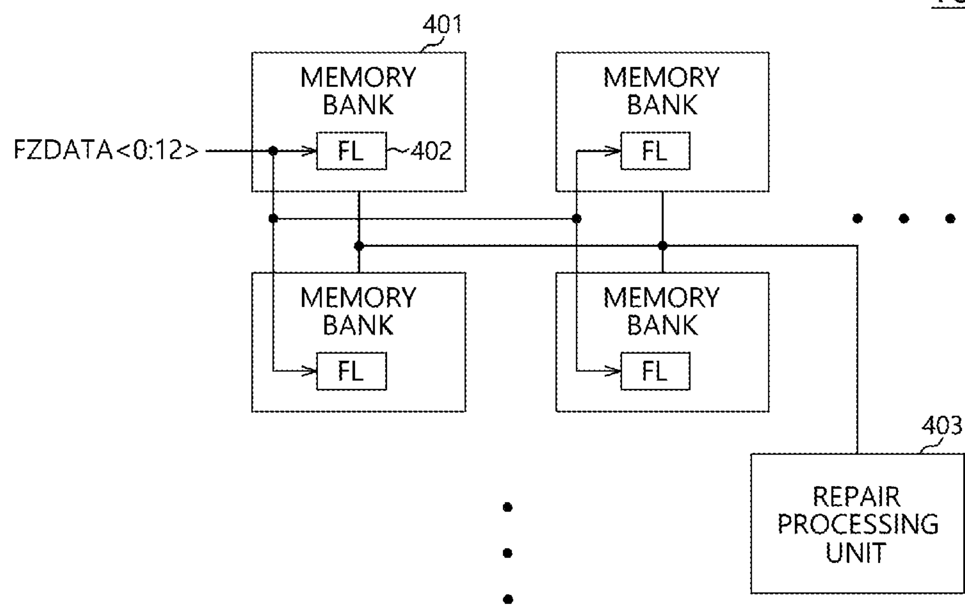
FIG. 6 is a diagram illustrating the configuration of a memory array block 106 of FIG. 2.

Referring to FIG. 6, the memory array block 106 may include a plurality of memory banks 401 and a repair processing unit 403.

Each of the memory banks 401 may include a fuse set latch array (FL) 402 installed therein.

The fuse set latch array 402 may correspond to the plurality of fuse sets 200 of the preliminary repair information storage circuit 104, and store the repair information FZDATA<0:12> which is read from the plurality of fuse sets 200 in advance, during a boot-up operation before a normal operation.

The fuse set latch array 402 may correspond to a component such as a buffer memory of a computer, and control the repair processing unit 403 to perform a repair operation within a shorter time than when a repair operation is performed in response to the repair information FZDATA<0:12> read from the respective fuse sets 200 during a semiconductor apparatus operation.

According to the validity determination bit FZDATA<0> of the repair information FZDATA<0:12>, the repair processing unit 403 may set the corresponding fuse set 200 in an unavailable state, such that a repair operation based on the repair information FZDATA<0:12> is not performed.

At this time, the repair operation may include an operation of storing the preliminary repair information D<0:12> in the corresponding fuse set 200, and an operation of comparing an address inputted from outside (hereafter, external address) to the repair information FZDATA<0:12> stored in the fuse set latch array 402, and accessing a normal cell or redundant cell corresponding to the external address.

When the validity determination bit FZDATA<0> is logic low, it may indicate that the corresponding fuse set 200 is not available. Therefore, the repair processing unit 403 may not store the preliminary repair information D<0:12> in the corresponding fuse set 200, but store the preliminary repair information D<0:12> in another fuse set 200.

When the validity determination bit FZDATA<0> of the repair information FZDATA<0:12> is logic high, the repair processing unit 403 may determine that the repair information FZDATA<1:12> is valid, and perform a repair information based on the repair information FZDATA<0:12>.

When the validity determination bit FZDATA<0> of the repair information FZDATA<0:12> is logic low, the repair processing unit 403 may determine that the repair information FZDATA<1:12> is not valid, and not perform a repair information based on the repair information FZDATA<0:12>.

When a fuse defect or specifically enable fuse defect occurred in the existing method, the preliminary repair information D<1:12> stored in the corresponding fuse set 200 is invalid information which is not an actual defective address, but cannot notify a defect of the enable fuse to the memory array block 106. Therefore, since the semiconductor apparatus may be abnormally operated while a repair operation can be performed, the semiconductor chip cannot be used.

In a present embodiment, however, although a defect occurs in the enable fuse, a fuse allocated to the defect check information PAR may be ruptured to set the validity determination bit FZDZTA<0> to a logic low level, such that a repair operation is not performed. That is, only a fuse set including a fuse in which a defect occurred, among the whole fuse sets 200, can be set to an unavailable state.

While certain embodiments have been described above, it will be understood to those skilled in the art that the embodiments described are by way of example only. Accordingly, the semiconductor apparatus described herein should not be limited based on the described embodiments. Rather, the semiconductor apparatus described herein should only be limited in light of the claims that follow when taken in conjunction with the above description and accompanying drawings.

What is claimed is:

1. A semiconductor apparatus comprising:

a repair information storage circuit comprising a fuse set for storing a preliminary repair information and a defect check information;

an error calculation circuit configured to generate repair information according to the preliminary repair information, and generate a validity determination bit as one piece of information in the repair information, using the preliminary repair information and the defect check information, the validity determination bit defining whether the fuse set has a defect; and a repair processing unit configured to set a fuse set latch in a memory array block in an unavailable state according to the validity determination bit, wherein the memory array block is set to the corresponding fuse set in the unavailable state.

2. The semiconductor apparatus of claim 1, wherein the memory array block is configured to decide whether to perform a repair operation based on the repair information, according to the validity determination bit.

3. The semiconductor apparatus of claim 1, wherein a fuse allocated to any one of bits contained in the preliminary repair information is an enable fuse for storing a signal indicating that a defective address is stored in the fuse set.

4. The semiconductor apparatus of claim 1, wherein the defect check information is stored in a spare fuse among a plurality of fuses included in the fuse set.

5. The semiconductor apparatus of claim 1, wherein the error calculation circuit comprises:

a validity determination bit generation circuit configured to generate the validity determination bit by performing an XOR operation on the preliminary repair information and the defect check information; and a plurality of buffers configured to buffer the respective bits of the preliminary repair information excluding the validity determination bit, and output the buffered information as the repair information.

6. The semiconductor apparatus of claim 1, wherein the memory array block comprises:

a plurality of memory banks each having a fuse set latch array arranged therein; and a repair processing unit configured to set the fuse set in an unavailable state according to the validity determination bit of the repair information.

7. The semiconductor apparatus of claim 6, wherein a repair operation based on the repair information is not performed corresponding to the fuse set in the unavailable state.

8. The semiconductor apparatus of claim 6, wherein a fuse set array is configured to store the repair information, read from the fuse set according to a read command, during a boot-up mode operation.

9. The semiconductor apparatus of claim 8, wherein the fuse set array is configured to store the repair information, read from the fuse set according to the read command, during the boot-up mode operation and before a normal operation.

10. The semiconductor apparatus of claim 1, wherein a repair operation corresponding to the validity determination bit is not performed when the fuse set is set in the unavailable state.

* * * * *